United States Patent
Conradi et al.

(10) Patent No.: US 6,304,622 B1
(45) Date of Patent: Oct. 16, 2001

(54) FLEXIBLE BIT RATE CLOCK RECOVERY UNIT

(75) Inventors: Jan Conradi, Corning, NY (US); Manish Sharma, North Brunswick, NJ (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/441,602

(22) Filed: Nov. 17, 1999

(51) Int. Cl.⁷ ........................................................ H04L 7/00
(52) U.S. Cl. ............................................. 375/354; 375/371
(58) Field of Search ................................... 375/326, 327, 375/294, 215, 355, 354, 359, 376, 372, 371; 327/141, 147, 152, 156, 144; 329/307; 370/518

(56) References Cited

U.S. PATENT DOCUMENTS

| | | | |
|---|---|---|---|
| 5,642,386 | * | 6/1997 | Rocco, Jr. ............................. 375/355 |
| 5,657,318 | * | 8/1997 | Ohmori et al. ....................... 370/516 |
| 5,828,250 | * | 10/1998 | Konno .................................. 327/116 |
| 5,909,473 | * | 6/1999 | Aoki et al. ........................... 375/373 |
| 5,920,600 | * | 7/1999 | Yamaoka et al. .................... 375/376 |
| 5,939,912 | * | 8/1999 | Rehm .................................. 327/158 |
| 5,952,888 | * | 9/1999 | Scott ........................................ 331/2 |
| 5,974,086 | * | 10/1999 | Oliboni et al. ....................... 375/225 |
| 6,130,584 | * | 10/2000 | Yoshida ................................. 331/11 |
| 6,166,572 | * | 12/2000 | Yamaoka .............................. 327/149 |
| 6,211,741 | * | 4/2001 | Dalmia ................................... 331/11 |

OTHER PUBLICATIONS

Ushirozawa, M.; Asahi, K; Noda, A.; Fujita S. "Bit–rate–Independent SDH/SONET Regenerator for Optical Network" from the 11ᵗʰ Annual International Conference on Integrated Optics and Optical Fibre Communications 23ʳᵈ European Conference on Optical Communications IOOC–ECOC 97, Edinburgh, UK; Sep. 22–25, 1997 (Conf. Publ. No. 448) p. 5 vol. (xiii+202+xvi+296+xviii+370+viii+120+vii+92), 25–8 vol. 4.

* cited by examiner

Primary Examiner—Chi Pham
Assistant Examiner—Emmanuel Bayard
(74) Attorney, Agent, or Firm—Harness, Dickey & Pierce, P.L.C.

(57) ABSTRACT

A flexible bit rate clock recovery unit is provided for recovering a clock signal from an input data signal, where the input data signal is transmissible at different bit rates. The flexible bit rate clock recovery unit includes a plurality of fixed rate clock recovery units, where each fixed rate clock recovery units is operative at a different bit rate to extract an intermediary clock signal from the input data signal; a comparator for generating an encoded data signal based on an amplitude characteristic of each of the intermediary clock signals, where the encoded data signal is indicative of the clock signal associated with the input data signal; and a selector for selecting one of the intermediary clock signals based on the encoded data signal, thereby recovering the clock signal from the input data signal.

15 Claims, 3 Drawing Sheets ial signal. A high speed limiting or variable gain amplifier 14
FLEXIBLE BIT RATE CLOCK RECOVERY UNIT

BACKGROUND OF THE INVENTION

1. Field of the Invention

The present invention relates generally to a regenerator device in an optical network, and particularly to a flexible bit rate clock recovery unit for use in the regenerator device.

2. Technical Background

Regenerators are used in optical communication systems to prevent the accumulation of signal distortion. A regenerator typically performs re-amplification, re-shaping and re-timing functions on an incoming data signal. In order to perform the re-timing function, it is necessary to extract the clock signal associated with the incoming data signal.

Conventional clock recovery units have only limited tuning range (e.g., typically less than 1% of the clock rate). This type of clock recovery unit does not pose a problem for optical communication systems which operate at a single bit rate. However, today's optical communication system must support input data signals transmissible at a variety of different bit rates.

Therefore, it is desirable to provide a clock recovery unit for recovering clock signals from input data signals transmissible at a variety of different bit rates. The clock recovery unit should identify the bit rate of the incoming data signal and extract the clock signal from it so that the incoming data signal can be correctly re-timed for retransmission.

SUMMARY OF THE INVENTION

One aspect of the present invention is a flexible bit rate clock recovery unit for recovering a clock signal from an input data signal, where the input data signal is transmissible at different bit rates. The flexible bit rate clock recovery unit includes a plurality of fixed rate clock recovery units, where each fixed rate clock recovery units is operative at a different bit rate to extract an intermediary clock signal from the input data signal; a comparator for generating an encoded data signal based on an amplitude characteristic of each of the intermediary clock signals, where the encoded data signal is indicative of the clock signal associated with the input data signal; and a selector for selecting one of the intermediary clock signals based on the encoded data signal, thereby recovering the clock signal from the input data signal.

Additional features and advantages of the invention will be set forth in the detailed description which follows, and in part will be readily apparent to those skilled in the art from that description or recognized by practicing the invention as described in the detailed description which follows, the claims as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various features and embodiments of the invention, and together with the description serve to explain the principles and operation of the invention.

DETAILED DESCRIPTION OF THE PREFERRED EMBODIMENT

Figure 1:
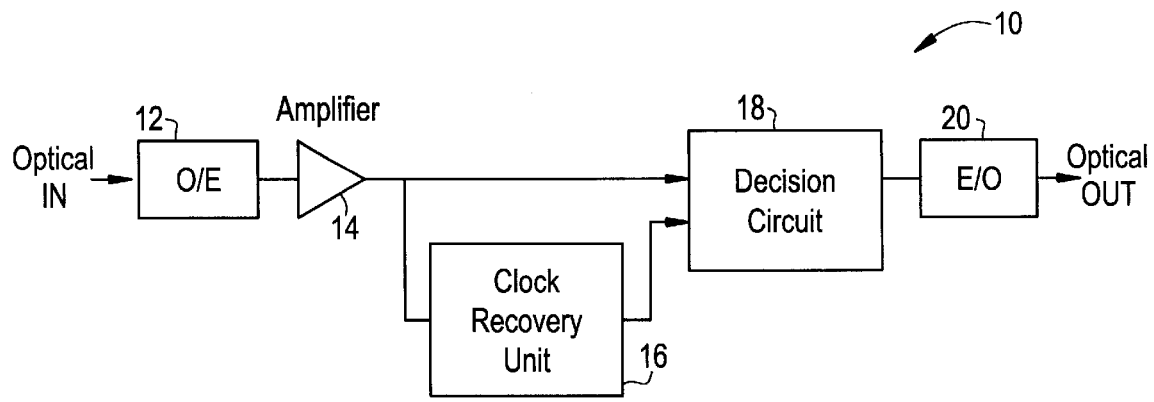
FIG. 1 is a block diagram of an exemplary opto-electronic regenerator in accordance with the present invention.

Reference will now be made in detail to the presently preferred embodiments of the invention, examples of which are illustrated in the accompanying drawings. Whenever possible, the same reference numerals will be used throughout the drawings to refer to the same or like parts.

Regenerator devices are used in optical communication systems to prevent the accumulation of signal distortion. A regenerator device typically performs reamplification, re-shaping and re-timing functions on an incoming data signal. An exemplary opto-electronic regenerator 10 is shown in FIG. 1. The regenerator 10 includes an optical-to-electrical (O/E) converter 12, an amplifier 14, a clock recovery unit 16, a decision circuit 18, and an electrical-to-optical (E/O) converter 20.

In operation, an incoming optical data signal is received by the O/E converter 12 and converted into an electrical data signal. A high speed limiting or variable gain amplifier 14 with automatic level control is used to amplify the electrical data signal to a particular amplitude. A portion of this amplified signal is then fed to the clock recovery circuit 16 and to the decision circuit 18.

The clock recovery circuit 16 is used to extract the clock signal from the incoming data signal. A decision circuit 18 then uses the clock signal to carry out the re-timing and re-shaping functions on the incoming data signal as provided by the amplifier 14. Lastly, the regenerated electrical signal from the decision circuit is reconverted to an optical signal by the E/O converter 20.

Figure 2:
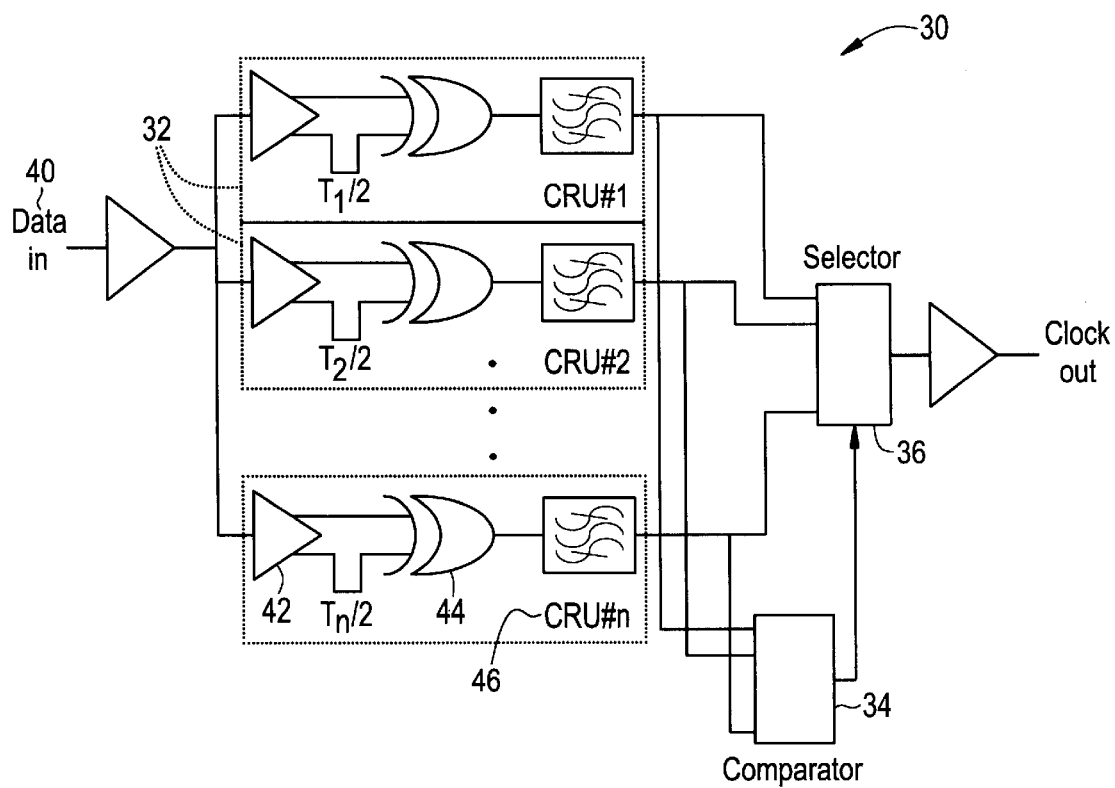
FIG. 2 is a block diagram of a first preferred embodiment for a flexible bit rate clock recovery unit of the present invention.

In order to support input data signals transmissible at a variety of different bit rates, a flexible bit rate clock recovery unit is needed for use in the regenerator device. An exemplary embodiment of a flexible bit rate clock recovery unit 30 of the present invention is shown in FIG. 2. Although the present invention is not limited to a regenerator device, an exemplary use of the flexible bit rate clock recovery unit 30 would be in an opto-electronic regenerator device.

In accordance with the present invention, the flexible bit rate clock recovery unit 30 includes a plurality of fixed bit rate clock recovery units 32, a comparator 34 and a selector 36. An input data signal 40 is fed into a bank of conventional fixed bit rate clock recovery units 32. A fixed bit rate clock recovery unit 32 is provided for each bit rate supported by the invention. In this way, an intermediary clock signal is extracted from the input data signal by each of the fixed bit rate clock recovery units 32. However, the correct clock signal is extracted by the fixed bit rate clock recovery unit 32 that operates at the bit rate of the input data signal.

As shown in FIG. 2, each fixed bit rate clock recovery unit 32 may include an amplifier 42, an exclusive OR gate 44, and a narrowband filter 46. In operation, the input data signal is fed into the amplifier 42 which in turn provides two amplified data signals to the exclusive OR gate 44. One of the amplified data signals is delayed by half the bit period relative to the other data signal. By using a narrowband filter 46, an intermediary clock signal is extracted from the output data signal from the exclusive OR gate 44. In this embodiment, it is envisioned that a mixer could be used in place of the exclusive OR gate 44. Although this embodiment is presently preferred for the fixed bit rate clock recovery unit 32, this is not intended as a limitation of the broader aspects of this invention. On the contrary, other embodiments of a fixed bit rate clock recovery unit may be suitably used in the flexible bit rate clock recovery unit 30.

A comparator 34 is then used to generate an encoded data signal which is indicative of the clock signal associated with the input data signal. In particular, the comparator 34 receives each of the intermediary clock signals and compares the amplitudes of each of the intermediary clock signals. An indicator for the intermediary clock signal having the largest amplitude is encoded into a digital data signal which is output by the comparator. For instance, if the flexible bit rate clock recovery unit 30 supports sixteen (16) different bit rates (i.e., sixteen fixed bit rate clock recovery units), then a four bit word may be used as the encoded digital data signal. Thus, the encoded data signal is indicative of the clock signal associated with the input data signal.

Lastly, a selector 36 is used to select the appropriate clock signal. To do so, the selector 36 receives each of the intermediary clock signals from the fixed bit rate clock recovery units 32. The selector 36 passes one of the intermediary clock signals based on the encoded data signal received from the comparator 34, thereby recovering the clock signal from the input data signal. The selector 36 may be embodied as either an analog or a digital switch. One skilled in the art will readily recognize that the selector 36 may also be operative to re-shape the selected intermediary clock signal into a recovered clock signal.

Figure 3:
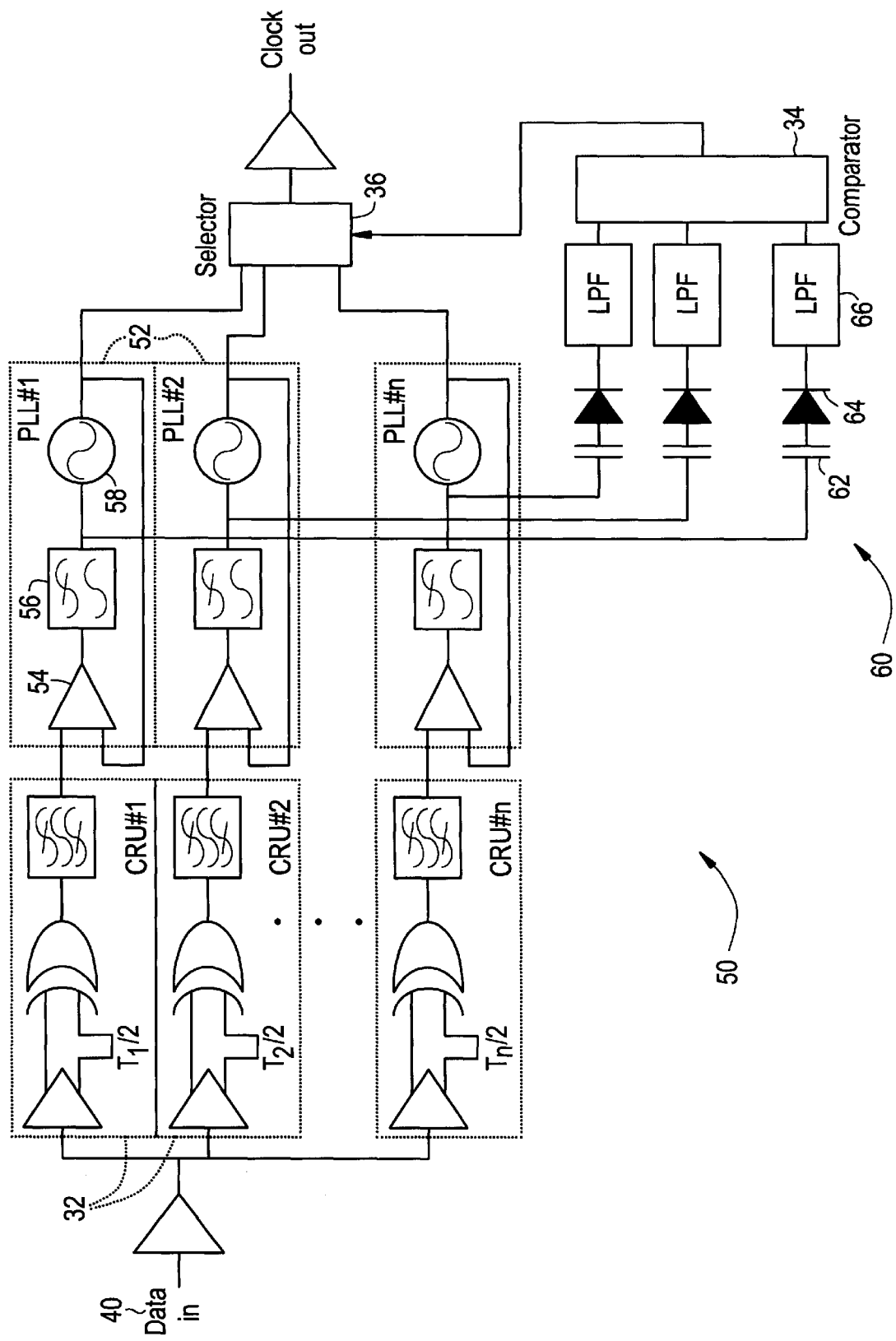
FIG. 3 is a block diagram of a second preferred embodiment for a flexible bit rate clock recovery unit of the present invention.

An alternative embodiment of a flexible bit rate clock recovery unit 50 in accordance with the present invention is shown in FIG. 3. In this embodiment, a phase-locked loop circuit 52 is disposed between each of the fixed bit rate clock recovery units 32 and the selector 36. As is known in the art, each of the phaselocked loop circuits 52 includes a phase detector 54, a filter 56, and voltage controlled oscillator 58. The components for this embodiment are otherwise as previously discussed in relation to FIG. 2.

In operation, the frequency stability of the phase-locked clock source is used as the criterion by which one of the intermediary clock signals is selected. The frequency stability is determined by the fluctuation (i.e., noise) of the control voltage associated with the voltage controlled oscillator 58. The fluctuation is measured by rectifying the ac-coupled control voltage. To do so, a rectifying circuit 60 is disposed between the filter 56 of the phase-locked loop circuit 52 and the comparator 34. Although the invention is not limited to this embodiment, an exemplary rectifying circuit 60 may include a capacitor 62, a diode 64 and a low pass filter 66 as shown in FIG. 3. This alternative embodiment can otherwise operate as discussed in relation to FIG. 2.

Figure 4:
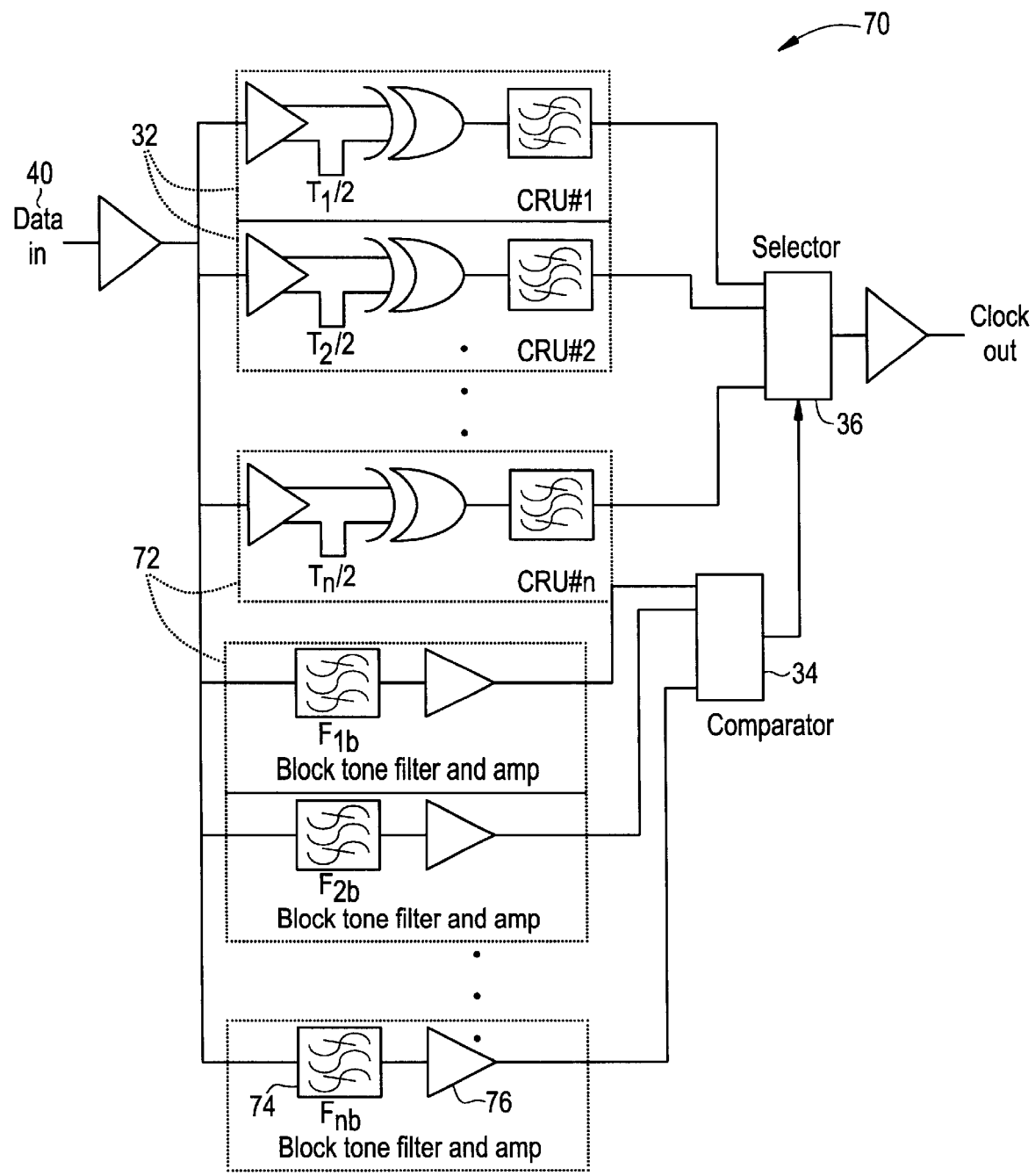
FIG. 4 is a block diagram of a third preferred embodiment for a flexible bit rate clock recovery unit of the present invention.

Data signals which use block codes (such as 4B5B or 8B10B) can be identified by looking for strong frequency components at the block rate. For example, a Fast Ethernet or a FDDI signal can be identified by looking for the 25 MHz tone which corresponds to the block rate. Similarly, a Gigabit Ethernet signal can be identified by looking for a tone at 125 MHz which corresponds to the 8B10B block code rate. If the relative amplitude of the signal tone is greater than a predetermined threshold, then the corresponding block rate and hence bit rate of the signal can be determined for the incoming data signal. FIG. 4 illustrates another embodiment of the present invention using block tones to determine signal type.

In this embodiment, a plurality of block tone recovery units 72 are also incorporated into the flexible bit rate clock recovery unit 70. Each block tone recovery unit 72 includes a filter 74 and an amplifier 76 which is used to filter and amplify signal tones corresponding to the block rate if the incoming signal. Again, based on the amplitude characteristic of these tones, the correct signal format, and thus bit rate can be identified by the comparator 34. In this case, the plurality of conventional fixed bit rate clock recovery unit 32 are still used to re-time the data signal. The components and mode of operation for this embodiment are otherwise as discussed in relation to FIG. 2.

It will be apparent to those skilled in the art that various modifications and adaptations can be made to the present invention without departing from the spirit and scope of the invention. Thus, it is intended that the present invention cover the modifications and adaptations of this invention, provided they come within the scope of the appended claims and their equivalents.

What is claimed:

1. A flexible bit rate clock recovery unit for recovering a clock signal from an input data signal, the input data signal transmissible at different bit rates, comprising:

a plurality of fixed rate clock recovery units each receiving the input data signal, each of said fixed rate clock recovery units operative at a different bit rate to extract an intermediary clock signal from the input data signal;

a comparator receiving each of the intermediary clock signals and generating an encoded data signal indicative of the clock signal associated with the input data signal; and a selector receiving the encoded data signal from said comparator and each of the intermediary clock signals from said plurality of fixed rate clock recovery units, said selector operative to select one of the intermediary clock signals based on the encoded data signal, thereby recovering the clock signal from the input data signal.

2. The flexible bit rate clock recovery unit of claim 1 wherein said comparator determines the encoded data signal based on an amplitude characteristic of each of the intermediary clock signals.

3. The flexible bit rate clock recovery unit of claim 1 further comprises a phase-locked loop circuit disposed between each of said plurality of clock recovery units and said selector.

4. The flexible bit rate clock recovery unit of claim 3 wherein said phase-locked loop circuit includes a phase detector connected to one of said clock recovery units, a filter connected to said phase detector, and a voltage-controller oscillator connected to said phase detector and said selector.

5. The flexible bit rate clock recovery unit of claim 4 wherein the filter of each of said phase-locked loop circuits further connects to said comparator.

6. The flexible bit rate clock recovery unit of claim 5 further comprises a rectifying circuit disposed between the filter of each of said phase-locked loop circuits and said comparator, each rectifying circuit includes a capacitor, a diode and a low pass filter.

7. The flexible bit rate clock recovery unit of claim 1 wherein each of said fixed rate clock recovery units includes a amplifier, an exclusive OR gate and a narrowband filter.

8. A method for recovering a clock signal from an input data signal, the input data signal transmissible at different bit rates, comprising the steps of:
   receiving the input data signal into a plurality of fixed rate clock recovery units;
   extracting a plurality of intermediary clock signals from the input data signal, each of said clock recovery units operative at a different bit rate to extract an intermediary clock signal from the input data signal; and
   selecting one of the plurality of intermediary clock signals based on amplitude characteristics of the intermediary clock signals, thereby recovering a clock signal from the input data signal.

9. The method of claim 8 further comprising the steps of:
   receiving each of the intermediary clock signals into a comparator;
   generating an encoded data signal based on amplitude characteristics of the intermediary clock signals, the encoded data signal indicative of the clock signal associated with the input data signal;
   receiving the encoded data signal and each of the intermediary clock signals into a selector; and
   passing one of the plurality of intermediary clock signals by said selector based on the encoded data signal.

10. The method of claim 8 wherein each of said fixed rate clock recovery units includes a amplifier, an exclusive OR gate and a narrowband filter.

11. The method of claim 9 further comprising the steps of:
   providing a phase-locked loop circuit disposed between each of said plurality of fixed bit rate clock recovery units and said selector, each of said phase-locked loop circuits having a phase detector, a filter and a voltage controlled oscillator;
   measuring a frequency stability of a control voltage for said voltage controlled oscillator; and
   selecting one of the plurality of intermediary clock signals based on the frequency stability of said control voltage, thereby recovering a clock signal from the input data signal.

12. The method of claim 11 further comprising the step of providing a rectifying circuit disposed between the filter of the phase-locked loop circuit and said comparator for measuring the frequency stability of said control voltage.

13. A flexible bit rate clock recovery unit for recovering a clock signal from an input data signal, the input data signal transmissible at different bit rates, comprising:
   a plurality of fixed rate clock recovery units each receiving the input data signal, each of said fixed rate clock recovery units operative at a different bit rate to extract an intermediary clock signal from the input data signal;
   a plurality of block tone recovery units each receiving the input data signal, each of said block tone recovery units operative at a different block rate to extract a signal indicative of the tone of the input data signal;
   a comparator receiving each of the signals from said plurality of block tone recovery units and generating an encoded data signal indicative of the clock signal associated with the input data signal; and
   a selector receiving the encoded data signal from said comparator and each of the intermediary clock signals from said plurality of fixed rate clock recovery units, said selector operative to select one of the intermediary clock signals based on the encoded data signal, thereby recovering the clock signal from the input data signal.

14. The flexible bit rate clock recovery unit of claim 13 wherein each of said plurality of block tone recovery units includes a filter for identifying a frequency characteristic of the input data signal indicative of the tone of the input data signal.

15. The flexible bit rate recovery unit of claim 13 wherein said comparator determines the encoded data signal based on an amplitude characteristic of each signal from said plurality of block tone recovery units.

* * * * *